(12) United States Patent
Choi et al.

(10) Patent No.: US 8,178,879 B2
(45) Date of Patent: May 15, 2012

(54) ARRAY SUBSTRATE FOR DISPLAY DEVICE AND METHOD OF FABRICATING THE SAME

(75) Inventors: Hee-Dong Choi, Seosan-si (KR); Seong-Moh Seo, Suwon-si (KR)

(73) Assignee: LG Display Co., Ltd., Seoul (KR)

( * ) Notice: Subject to any disclaimer, the term of this patent is extended or adjusted under 35 U.S.C. 154(b) by 171 days.

(21) Appl. No.: 12/795,430

(22) Filed: Jun. 7, 2010

(65) Prior Publication Data

US 2011/0114962 A1 May 19, 2011

(30) Foreign Application Priority Data

Nov. 16, 2009 (KR) .................. 10-2009-0110377

(51) Int. Cl.
*H01L 29/04* (2006.01)
(52) U.S. Cl. ..... 257/59; 257/72; 257/258; 257/E33.053; 257/E29.294; 438/158; 438/166
(58) Field of Classification Search .............. 257/59, 257/72, 258, E33.053, E29.294; 438/158, 438/166

See application file for complete search history.

(56) References Cited

U.S. PATENT DOCUMENTS

2008/0002125 A1* 1/2008 Kim .............................. 349/140

* cited by examiner

*Primary Examiner* — Tan N Tran
(74) *Attorney, Agent, or Firm* — McKenna Long & Aldridge, LLP

(57) ABSTRACT

An array substrate for a display device includes a gate electrode on a substrate; a gate insulating layer on the gate electrode and having the same plane area and the same plane shape as the gate electrode; an active layer on the gate insulating layer and exposing an edge of the gate insulating layer; an interlayer insulating layer on the active layer and including first and second active contact holes, the first and second active contact holes respectively exposing both sides of the active layers; first and second ohmic contact layers contacting the active layer through the first and second active contact holes, respectively; a source electrode on the first ohmic contact layer; a drain electrode on the second ohmic contact layer; a data line on the interlayer insulating layer and connected to the source electrode; a first passivation layer on the source electrode, the drain electrode and the data line, the first passivation layer, the interlayer insulating layer and the gate insulating layer have a first gate contact hole exposing a portion of the gate electrode; a gate line on the first passivation layer and contacting the gate electrode through the first gate contact hole, the gate line crossing the data line; a second passivation layer on the gate line and having a drain contact hole exposing the drain electrode; and a pixel electrode on the second passivation layer and contacting the drain electrode through the contact hole.

20 Claims, 6 Drawing Sheets dry-etching crystallizing ashing

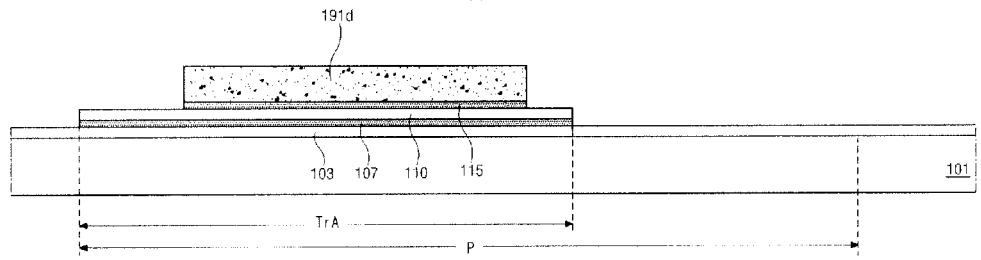
FIG. 4F
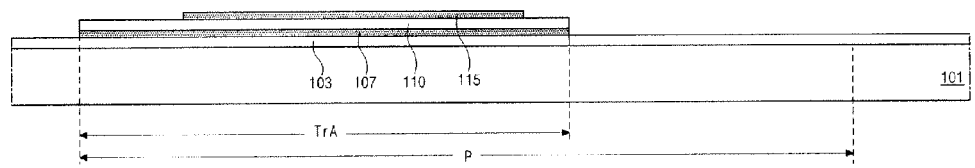
FIG. 4G
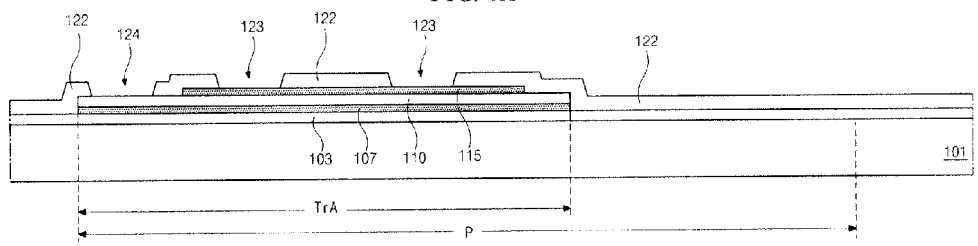
FIG. 4H
FIG. 4I
BOE cleaning
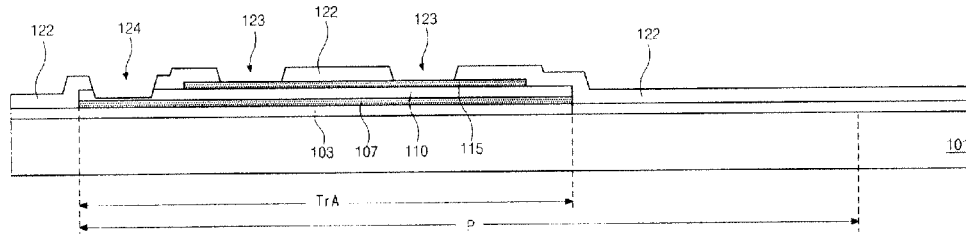

ARRAY SUBSTRATE FOR DISPLAY DEVICE AND METHOD OF FABRICATING THE SAME

The present application claims the benefit of Korean Patent Application No. 2009-0110377, filed in Korea on Nov. 16, 2009, which is hereby incorporated by reference.

BACKGROUND OF THE INVENTION

1. Field of the Invention

The present invention relates to an array substrate for a display device, and more particularly, to an array substrate for a display device that includes a thin film transistor having excellent properties and a method of fabricating the array substrate.

2. Discussion of the Related Art

As the society has entered in earnest upon an information age, a field of display devices that represent all sorts of electrical signals as visual images has developed rapidly. Particularly, the liquid crystal display (LCD) device or the OELD device as a flat panel display device having characteristics of light weight, thinness and low power consumption is developed to be used as a substitute for a display device of cathode-ray tube type.

Since the LCD device including a thin film transistor (TFT) as a switching element, referred to as an active matrix LCD (AM-LCD) device, has excellent characteristics of high resolution and displaying moving images, the AM-LCD device has been widely used.

On the other hand, since the OELD device has excellent characteristics of high brightness, a low power consumption and high contrast ratio, the OELD device has been widely used. Moreover, the OELD device has advantages of a high response rate, a low production cost and so on.

Both the LCD device and the OELD device require an array substrate including a thin film transistor (TFT) as a switching element for controlling on and off of each pixel region. In addition, the OELD device requires another TFT as a driving element for driving an organic electroluminescent diode in each pixel region.

FIG. 1 is a cross-sectional view of a portion of the related art array substrate for the display device. For convenience of explanation, a region, where a TFT is formed, is defined as a switching region TrA.

In FIG. 1, the array substrate includes a substrate 11 including a pixel region P and the switching region TrA. On the substrate 11, a gate line (not shown) and a data line 33 are formed to define the pixel region P. The gate line and the data line 33 cross each other to define the pixel region. In the switching region TrA in the pixel region P, a gate electrode 15 is formed, and a gate insulating layer 18 covers the gate electrode 15. A semiconductor layer 28 including an active layer 22 and an ohmic contact layer 26 is formed on the gate insulating layer 18 and in the driving region TrA. The active layer 22 is formed of intrinsic amorphous silicon, and the ohmic contact layer 26 is formed of impurity-doped amorphous silicon. A source electrode 36 and a drain electrode 38, which is spaced apart from the source electrode 36, are formed on the semiconductor layer 28. A portion of the ohmic contact layer 26 corresponding to a space between the source and drain electrodes 36 and 38 is removed such that a center of the active layer 22 is exposed through the space between the source and drain electrodes 36 and 38.

The gate electrode 15, the gate insulating layer 18, the semiconductor layer 28, the source electrode 36 and the drain electrode 38 constitute the TFT Tr. The TFT is connected to the gate line, the data line 33 and the TFT Tr.

A passivation layer 42 including a drain contact hole 45 is formed on the TFT Tr. The drain contact hole 45 exposes the drain electrode 38 of the TFT Tr. A pixel electrode 50 contacting the drain electrode 38 of the TFT Tr is formed on the passivation layer 42 and in each pixel region P. A semiconductor pattern 29 including a first pattern 27, which is formed of the same material and disposed on the same layer as the ohmic contact layer 26, and a second pattern 23, which is formed of the same material and disposed on the same layer as the active layer 22, is disposed under the data line 33.

The active layer 22 has a difference in a thickness. Namely, a center portion, which is exposed through the space between the source and drain electrodes 36 and 38, of the active layer 22 has a first thickness t1, and a side portion, on which the ohmic contact layer 26 is formed, of the active layer 22 has a second thickness t2 being different from the first thickness t1. (t1≠t2) The thickness difference in the active layer 22 is caused by a fabricating method. Properties of the TFT are degraded by the thickness difference in the active layer 22.

FIGS. 2A to 2E are cross-sectional views showing a process for forming the semiconductor layer, the source electrode and the drain electrode in the related art array substrate. For convenience of explanation, the gate electrode and the gate insulating layer are not shown.

In FIG. 2A, an intrinsic amorphous silicon layer 20, an impurity-doped amorphous silicon layer 24, and a metal layer 30 are sequentially formed on the substrate 11. A photoresist (PR) layer (not shown) is formed on the metal layer 30 by coating a PR material. The PR layer is exposed and developed to form first and second PR patterns 91 and 92. The first PR pattern 91 corresponds to a portion, where source and drain electrodes are formed, and has a third thickness. The second PR pattern 92 corresponds to a portion of a space between the source and drain electrodes, and has a fourth thickness smaller than the third thickness.

Next, in FIG. 2B, the metal layer 30 (of FIG. 2A) exposed by the first and second PR patterns 91 and 92, the impurity-doped amorphous silicon layer 24 (of FIG. 2A) and the intrinsic amorphous silicon layer 20 (of FIG. 2A) under the metal layer 30 are etched to form a metal pattern 31, an impurity-doped amorphous silicon pattern 25 under the metal pattern 31, and an intrinsic amorphous silicon pattern 22 under the impurity-doped amorphous silicon pattern 25.

Next, in FIG. 2C, the second PR pattern 92 (of FIG. 2B) is removed by an ashing process. At the same time, the third thickness of the first PR pattern 91 (of FIG. 2B) is reduced such that a third PR pattern 93 having a thickness smaller than the third thickness is formed on the metal pattern 31.

Next, in FIG. 2D, a center portion of the metal pattern 31 (of FIG. 2C) exposed by the third PR pattern 93 is etched to form the source electrode 36 and the drain electrode 38 spaced from the source electrode 36. By etching the metal pattern 31, a center portion of the impurity-doped amorphous silicon pattern 25 is exposed through the space between the source electrode 36 and the drain electrode 38.

Next, in FIG. 2E, the exposed center portion of the impurity-doped amorphous silicon pattern 25 (of FIG. 2D) is dry-etched to form the ohmic contact layer 26 under the source electrode 36 and the drain electrode 38. In this case, the dry-etching process for the exposed center portion of the impurity-doped amorphous silicon pattern is performed during a sufficient long time to completely remove the exposed center portion of the impurity-doped amorphous silicon pattern. By dry-etching the exposed center portion of the impurity-doped amorphous silicon pattern, a center portion of the active layer 22 of intrinsic amorphous silicon is partially etched. However, a side portion of the active layer 22 is not etched because the ohmic contact layer 26 blocks the side portion of the active layer 22. As a result, the active layer 22 has a thickness difference. (t1≠t2)

If the dry-etching process for the exposed center portion of the impurity-doped amorphous silicon pattern is not performed during a sufficient long time to avoid the thickness difference, the impurity-doped amorphous silicon may remain on the active layer 22 such that properties of the TFT is degraded. Accordingly, it is required to perform the dry-etching process for the exposed center portion of the impurity-doped amorphous silicon pattern during a sufficient long time.

Accordingly, in the above fabricating process for the related art array substrate, the thickness difference in the active layer is an inevitable result such that properties of the TFT is degraded.

In addition, since the intrinsic amorphous silicon layer for the active layer should be formed with a sufficient thickness, for example, more than about 1000 Å, considering etched thickness, production yield is reduced and production cost is increased.

Generally, the active layer for the TFT is formed of intrinsic amorphous silicon. Since atoms of intrinsic amorphous silicon are randomly arranged, it has a metastable state with light or an electric field such that there is a problem in stability as a TFT. In addition, since a carrier mobility in a channel is relatively low, i.e., 0.1 $cm^2/V \cdot S$~1.01 $cm^2/V \cdot S$, there is a limitation in use of a driving element.

To resolve these problems, a fabricating method of a thin film transistor, which includes an active layer of polycrystalline silicon by crystallizing amorphous silicon into polycrystalline silicon through a crystallizing process with a laser beam apparatus, is introduced.

However, referring to FIG. 3, which shows a cross-sectional view of the related art array substrate including the active layer of polycrystalline silicon, a doping process is required. Namely, in the array substrate 51 including the TFT Tr, high concentration impurities should be doped into both sides of the center region 55a of the semiconductor layer 55 of polycrystalline silicon to form n+ region 55b. The region 55b may be p+ region depending on a kind of the impurities. Accordingly, an implantation apparatus for the doping process is required, so new process line is required and production costs are increased.

SUMMARY OF THE INVENTION

Accordingly, the present invention is directed to an array substrate for a display device and a method of fabricating the same that substantially obviate one or more of the problems due to limitations and disadvantages of the related art.

An object of the present invention is to provide an array substrate including a thin film transistor having improved properties.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an array substrate for a display device includes a gate electrode on a substrate; a gate insulating layer on the gate electrode and having the same plane area and the same plane shape as the gate electrode; an active layer on the gate insulating layer and exposing an edge of the gate insulating layer; an interlayer insulating layer on the active layer and including first and second active contact holes, the first and second active contact holes respectively exposing both sides of the active layers; first and second ohmic contact layers contacting the active layer through the first and second active contact holes, respectively; a source electrode on the first ohmic contact layer; a drain electrode on the second ohmic contact layer; a data line on the interlayer insulating layer and connected to the source electrode; a first passivation layer on the source electrode, the drain electrode and the data line, the first passivation layer, the interlayer insulating layer and the gate insulating layer have a first gate contact hole exposing a portion of the gate electrode; a gate line on the first passivation layer and contacting the gate electrode through the first gate contact hole, the gate line crossing the data line; a second passivation layer on the gate line and having a drain contact hole exposing the drain electrode; and a pixel electrode on the second passivation layer and contacting the drain electrode through the contact hole.

In another aspect of the present invention, a method of fabricating an array substrate for a display device includes forming a gate electrode on a substrate, a gate insulating layer on the gate electrode and an active layer of intrinsic polycrystalline silicon on the gate insulating layer, the active layer exposing an edge of the gate insulating layer; forming an interlayer insulating layer on the active layer and having first and second active contact holes, the first and second active contact holes respectively exposing both sides of the active layer; forming first and second ohmic contact layers respectively contacting the both sides of the active layer through the first and second active contact holes, a source electrode on the first ohmic contact layer, a drain electrode on the second ohmic contact layer, and a data line connected to the source electrode; forming a first passivation layer on the source electrode, the drain electrode and the data line and including a first gate contact hole exposing the gate electrode; forming a gate line on the first passivation layer and contacting the first gate electrode through the first gate contact hole, the gate line crossing the data line; forming a second passivation layer on the gate line and including a drain contact hole exposing the drain electrode; and forming a pixel electrode on the second passivation layer and contacting the drain electrode through the drain contact hole.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENTS

Reference will now be made in detail to the preferred embodiments, examples of which are illustrated in the accompanying drawings.

Figure 1:
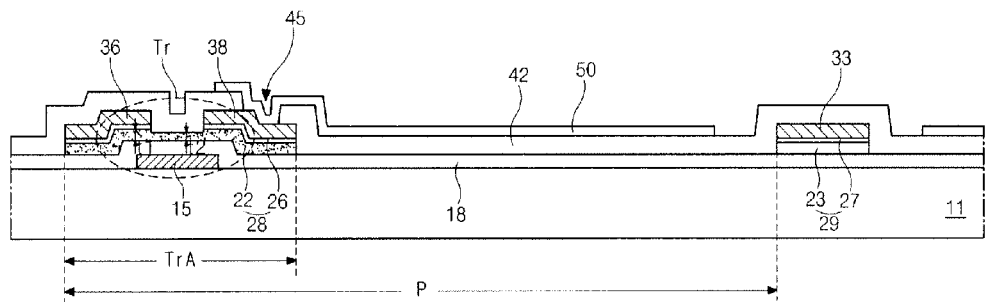
FIG. 1 is a cross-sectional view of a portion of the related art array substrate for the OELD device.
Figure 2A:
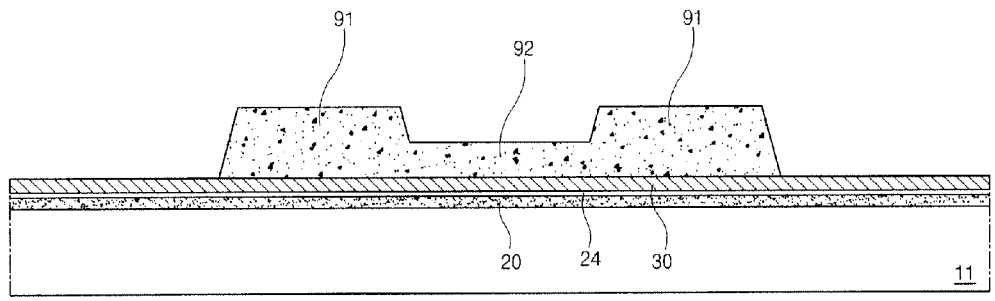
FIGS. 2A to 2E are cross-sectional views showing a process for forming the semiconductor layer, the source electrode and the drain electrode in the related art array substrate.
Figure 2B:
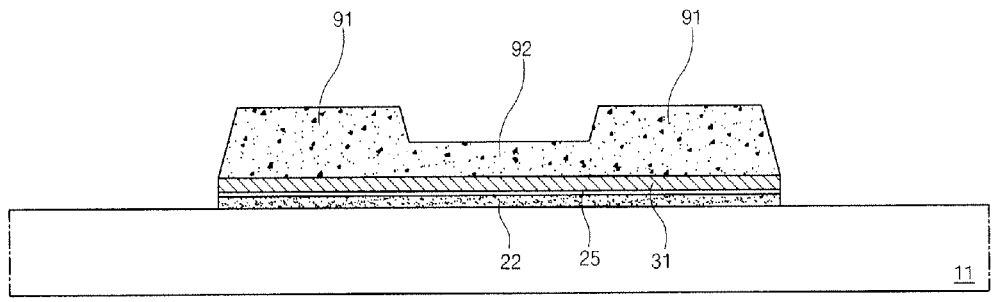
Figure 2C:
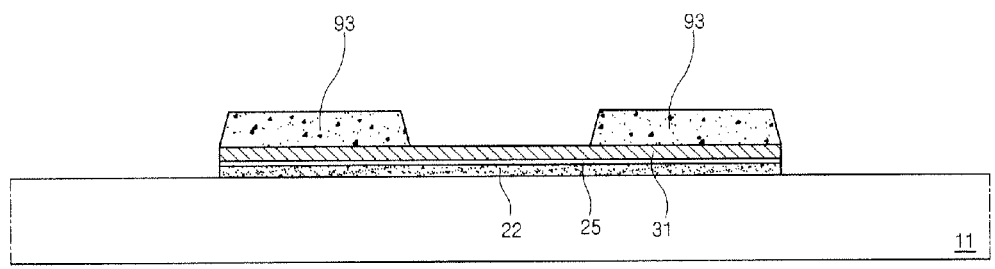
Figure 2D:
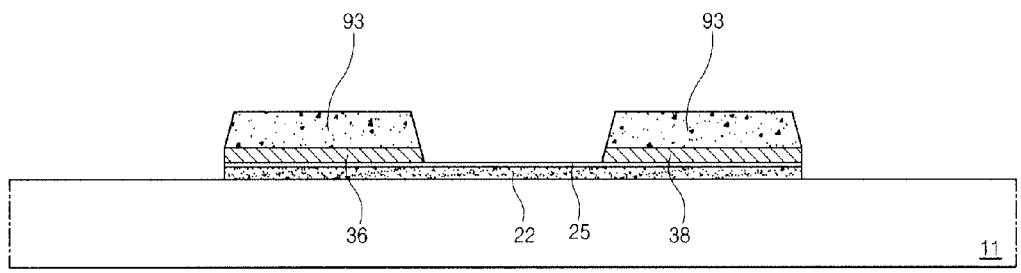
Figure 2E:
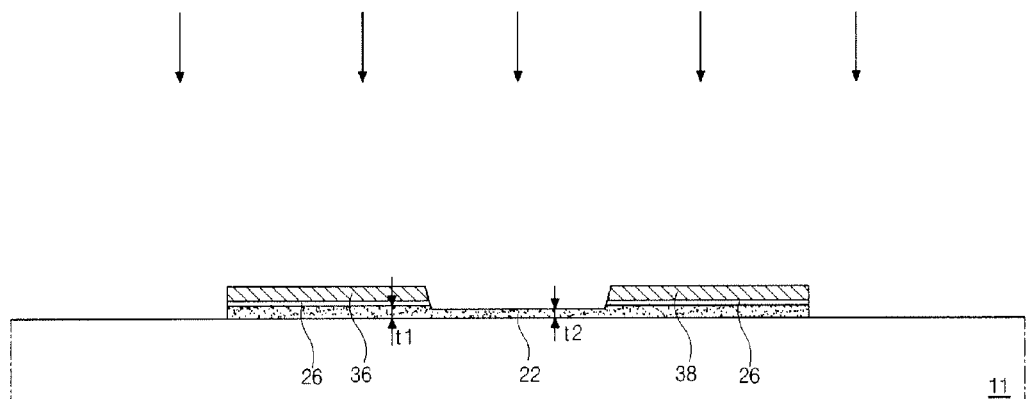
Figure 3:
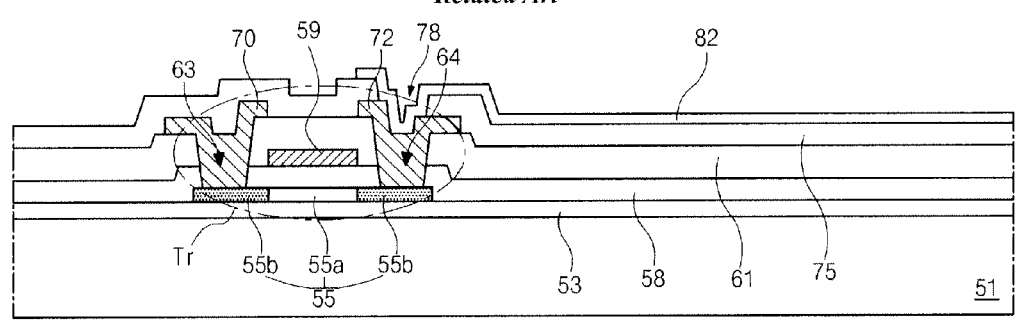
FIG. 3 is a cross-sectional view of the related art array substrate including the active layer of polycrystalline silicon.
Figure 4A:
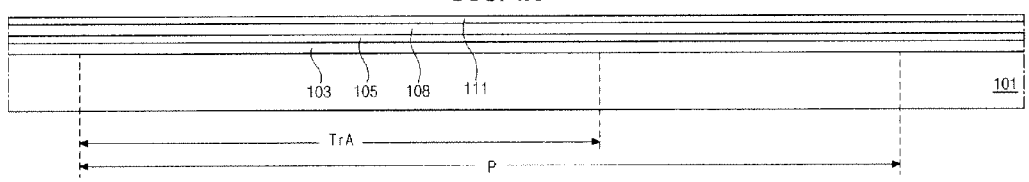
FIGS. 4A to 4N are cross-sectional views showing a fabricating process of an array substrate according to the present invention.
Figure 4B:
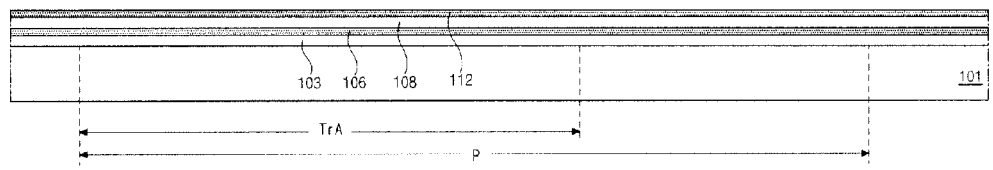
Figure 4C:
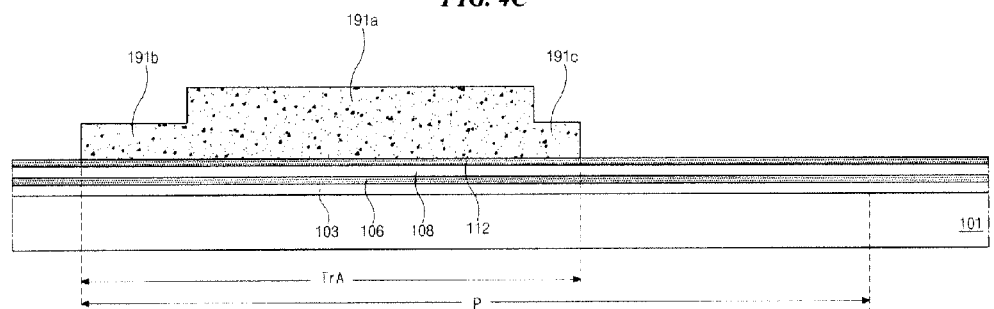
Figure 4D:
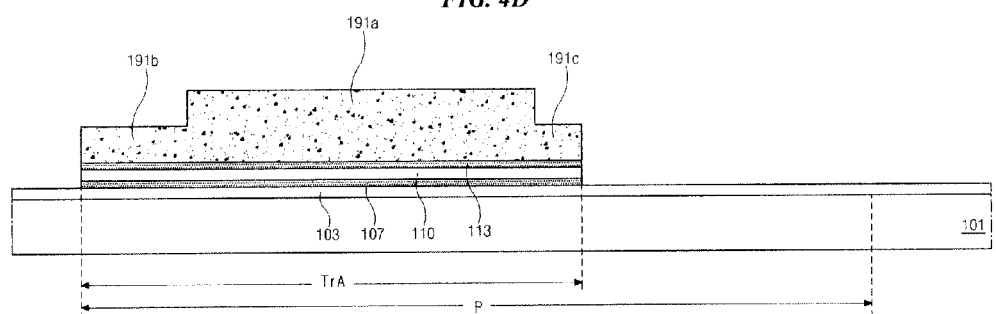
Figure 4E:
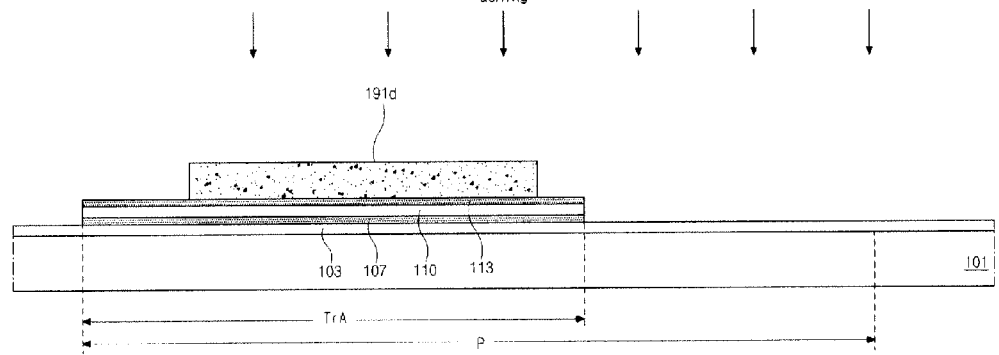
Figure 4J:
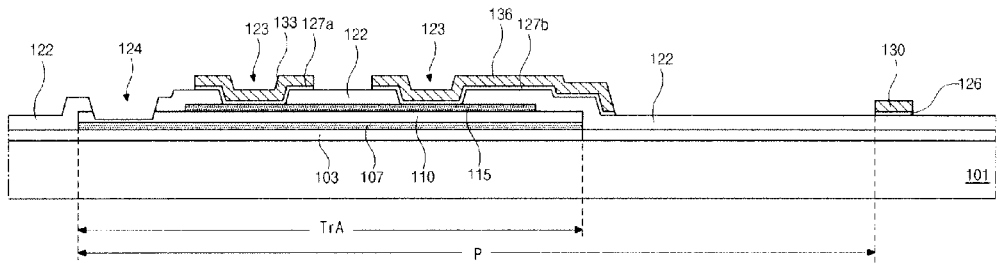
Figure 4K:
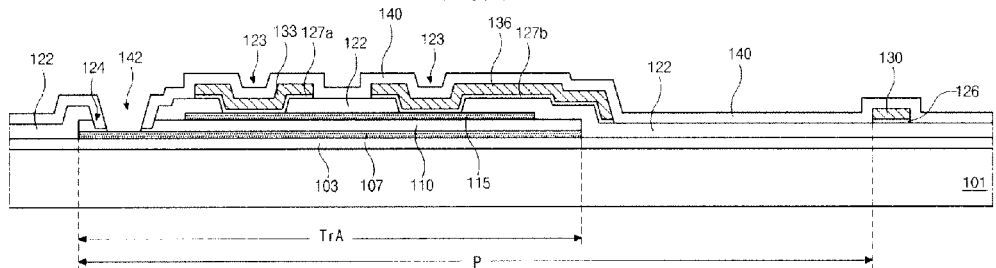
Figure 4L:
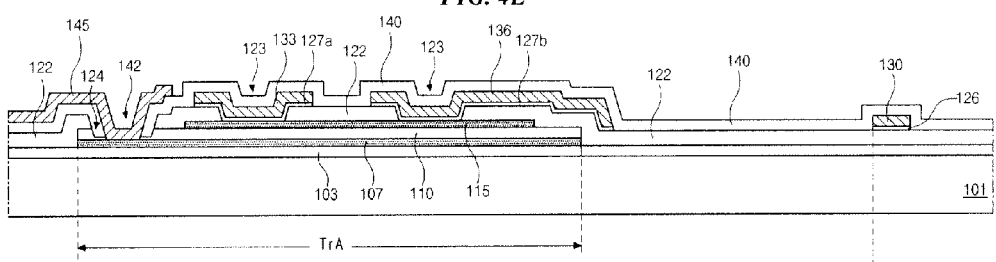
Figure 4M:
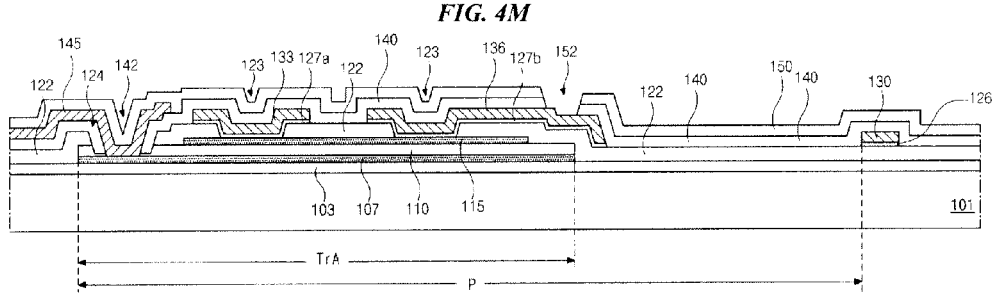
Figure 4N:
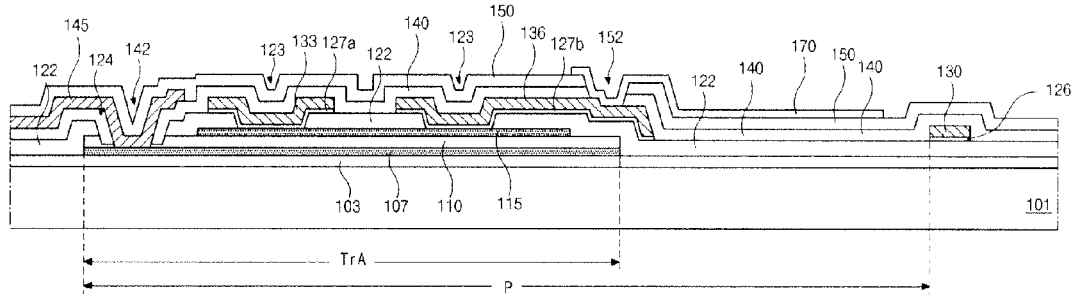

FIGS. 4A to 4N are cross-sectional views showing a fabricating process of an array substrate according to the present invention. For convenience of explanation, a region, where a thin film transistor (TFT) is formed, is defined as a switching region TrA in a pixel region P.

As shown in FIG. 4A, a buffer layer 103 is formed on a substrate 101 by depositing an inorganic insulating material or coating an organic insulating material. For example, the inorganic insulating material includes silicon oxide or silicon nitride, and the organic insulating material includes photo-acryl or BCB. The buffer layer 103 has a thickness of about 2000 to about 3000 Å. When a crystallizing process is performed under a temperature of about 600 to about 800° C., an alkali ion can be diffused into polycrystalline silicon without the buffer layer 103 when the substrate 101 is directly exposed to the high temperature in the crystallizing process. The problem can be prevented by the buffer layer 103.

Next, a gate material layer 105, a first insulating material layer 108 and an intrinsic amorphous silicon layer 111 are sequentially formed on the buffer layer 103.

The gate material layer 105 includes impurity-doped amorphous silicon. Alternatively, the gate material layer 105 includes a metallic material having a high melting point greater than about 800° C. For example, the metallic material for the gate material layer 105 includes one of titanium (Ti), tungsten (Tw), molybdenum alloy such as molybdenum-titanium alloy (MoTi), molybdenum (Mo), tantalum (Ta), copper (Cu), Cu alloy and combination thereof. In addition, the gate material layer 105 has a first layer of one of the above metallic materials and a second layer of another one of the above metallic materials. When the gate material layer 105 is formed of impurity-doped silicon, a thickness of the gate material layer is about 500 to about 1000 Å. When the gate material layer 105 is formed of the above metallic material, a thickness of the gate material layer is about 100 to about 1000 Å, beneficially, about 100 to about 500 Å.

If the gate material layer 105 is formed of a metallic material having a melting point less than 800° C., i.e., aluminum (Al) or Al alloy, the metallic material is melt during the crystallizing process such that the metallic material is diffused into the first insulating material layer 108.

The first insulating material layer 108 includes an inorganic insulating material or an organic insulating material. For example, the inorganic insulating material includes silicon oxide or silicon nitride, and the organic insulating material includes photo-acryl or BCB. The first insulating material layer 108 has a thickness of about 500 to 4000 Å. The intrinsic amorphous silicon layer 111 has a thickness of about 300 to 1000 Å. In the related art array substrate, considering a thickness etched by a dry-etching process for an ohmic contact layer, the intrinsic amorphous silicon layer has a thickness over about 1000 Å. However, since an active layer 115 (of FIG. 4M) of polycrystalline silicon from the intrinsic amorphous silicon layer 111 is not exposed to a dry-etching process, a thickness of the intrinsic amorphous silicon layer is not reduced after the dry-etching process. Accordingly, the intrinsic amorphous silicon layer of the present invention has a smaller thickness than that of the related art such that there are advantages in production costs and a process time.

When each of the buffer layer 103, the first insulating material layer 108 is formed of the inorganic insulating material and the gate material layer 105 is formed of impurity-doped amorphous silicon, all of the buffer layer 103, the gate material layer 105, the first insulating material layer 108 and the intrinsic amorphous silicon layer 111 are formed by a chemical vapor deposition (CVD) apparatus (not shown). By changing a reaction gas supplied to a process chamber of the CVD apparatus, the buffer layer 103, the gate material layer 105, the first insulating material layer 108 and the intrinsic amorphous silicon layer 111 can be sequentially deposited.

Hereinafter, a process is explained with the gate material layer 105 of impurity-doped amorphous silicon.

Next, as shown in FIG. 4B, a crystallizing process is performed to increase mobility in the channel such that the intrinsic amorphous silicon layer 111 (of FIG. 4A) is crystallized into an intrinsic polycrystalline silicon layer 112. The crystallizing process is a solid phase crystallization process or an excimer laser annealing process. For example, the solid phase crystallization process is a thermal crystallization process under a temperature of about 600 to about 800° C. or an alternating magnetic field crystallization process under a temperature of about 600 to 700° C.

The gate material layer 105 (of FIG. 4A) of impurity-doped amorphous silicon is also changed into an impurity-doped polycrystalline silicon layer 106 by the above crystallizing process.

On the other hand, since the above metallic material for the gate material layer has a melting point above about 800° C., the gate material layer is not deformed by the crystallizing process. If the gate material layer is formed of a metallic material having a relative low melting point, the layer is deformed by the crystallizing process. However, the gate material layer is formed of impurity-doped amorphous silicon or the above metallic material having a melting point above about 800° C., there is no problem during the crystallizing process.

Next, as shown in FIG. 4C, a photoresist (PR) layer (not shown) is formed on the intrinsic polycrystalline silicon layer 112 by coating a PR material. A mask (not shown) including a transmissive area, a blocking area, and a half-transmissive area is disposed over the PR layer. The half-transmissive area has a transmittance smaller than the transmissive area and larger than the blocking area. The half-transmissive area includes a plurality of slit or a plurality of coating layers to control transmittance. The PR layer is exposed using the mask.

Next, the exposed PR layer is developed to form first to third PR patterns 191a, 191b and 191c. The first PR pattern 191a corresponds to a center of the switching region TrA and has a first thickness. Namely, the first PR pattern 191a corresponds to a region where an active layer 115 (of FIG. 4N) will be formed. The second and third PR patterns 191b and 191c are disposed at both sides of the first PR pattern 191a, respectively. Namely, the first PR pattern 191a is positioned between the second and third PR patterns 191b and 191c. The intrinsic polycrystalline silicon layer 112 in the switching region TrA is covered with first to third PR patterns 191a to 191c, and the intrinsic polycrystalline silicon layer 112 in other regions is exposed. Each of the second and third PR patterns 191b and 191c has a second thickness smaller than the first thickness.

The second and third PR patterns 191b and 191c have different widths such that edges of the gate electrode 114 (of FIG. 4M), a gate insulating layer 109 (of FIG. 4M) and the active layer 115 (of FIG. 4M) has a stair shape. As a result, it is prevented for an interlayer insulating layer 122 (of FIG. 4M) from being gotten loose. In addition, a width of the second PR pattern 191b is larger than that of the third PR pattern 191c to provide an area for contacting the gate electrode 114 (of FIG. 4M) with a gate line 145 (of FIG. 4M). Since the gate electrode 114 and the gate line 145 are formed of different layers, an area, where a second gate contact hole 142 (of FIG. 4N) for contacting the gate line 145 to the gate electrode 114 is formed, is required.

Next, as shown in FIG. 4D, the exposed intrinsic polycrystalline silicon layer 112 (of FIG. 4C) and the first insulating layer 108 (of FIG. 4C) and the impurity-doped polycrystalline silicon layer 106 (of FIG. 4C) under the exposed intrinsic polycrystalline silicon layer 112 are sequentially etched to form the gate electrode 107 of impurity-doped polycrystalline silicon on the buffer layer 103, a gate insulating layer 110 on the gate electrode 107 and an intrinsic polycrystalline silicon pattern 113 on the gate insulating layer 110. The gate electrode 107, the gate insulating layer 110 and the intrinsic polycrystalline silicon pattern 113 are positioned in the switching region TrA and has an island shape. When the gate material layer 105 is formed of a metallic material having a melting point above about 800° C., the gate electrode 107 is formed of the metallic material. The buffer layer 103 in other region except the switching region TrA is exposed.

In the present invention, the gate electrode 107 is formed of impurity-doped polycrystalline silicon or a metallic material having a melting point above about 800° C. to resolve below problem. In a fabricating process of the bottom gate type TFT, the gate line and the gate electrode are formed on the substrate by depositing and patterning a metallic material having a low resistant property, and the semiconductor layer of amorphous silicon is formed over the gate electrode with the gate insulating layer therebetween. To crystallize the semiconductor layer, the crystallizing process is performed under a relatively high temperature, for example, above 600° C. During the crystallizing process, the gate electrode and the gate line of the metallic material are deformed. Or, the gate electrode protrudes through the gate insulating layer because of a thermal effect during the crystallizing process such that the gate electrode contacts the intrinsic polycrystalline silicon layer. It may be referred to as a spike problem. However, since the gate electrode 107 is formed of impurity-doped polycrystalline silicon or a metallic material having a melting point above about 800° C. in the present invention, there is no problem.

Next, as shown in FIG. 4E, an ashing process is performed on to the first to third PR patterns 191a to 191c (of FIG. 4D) to remove the second and third PR patterns 191b and 191c and form a fourth PR pattern 191d from the first PR pattern 191a. As a result, both sides of the intrinsic polycrystalline silicon layer 113 are exposed by removing the second and third PR patterns 191b and 191c. As mentioned above, since the second PR pattern 191b has a width larger than the third PR pattern 191c, the left-side exposed portion of the intrinsic polycrystalline silicon layer 113 has an area larger than the right-side exposed portion of the intrinsic polycrystalline silicon layer 113.

Next, as shown in FIG. 4F, the exposed intrinsic polycrystalline silicon layer 113 (of FIG. 4E) is etched to expose edges of the gate insulating layer 110 and form an active layer 115 from the intrinsic polycrystalline silicon pattern 113 under the fourth PR pattern 191d. The active layer 115 leans to the right-side with respect to a center of the gate electrode 107 to provide an area for a first gate contact hole 124 (of FIG. 4N) and a second gate contact hole 142 (of FIG. 4N). The gate insulating layer 110 and the gate electrode 107 under the gate insulating layer 110 has substantially the same plane area and the same plane shape to perfectly overlap each other.

Next, as shown in FIG. 4G, a stripping process is performed onto the fourth PR pattern 191d (of FIG. 4F) to remove the fourth PR pattern 191d and expose the active layer 115.

Next, as shown in FIG. 4H, a second insulating layer (not shown) is formed on the active layer 115 by depositing one or both of silicon oxide and silicon nitride or coating one or both of photo-acryl and BCB. Namely, the second insulating layer has a single-layered structure or a double-layered structure and is formed of an inorganic insulating material or an organic insulating material. The second insulating layer has a thickness equal to or larger than a thickness summation of the gate electrode 107 and the gate insulating layer 110. If the thickness of the second insulating layer is smaller than the thickness summation of the gate electrode 107 and the gate insulating layer 110, the second insulating layer may have a discontinuous portion at an end portion of the gate electrode 107 and the gate insulating layer 110.

The second insulating layer is patterned by a mask process, which includes a step of forming a PR layer, a step of exposing the PR layer using an exposing mask, a step of developing the PR layer to form a PR pattern, a step of etching the second insulating layer using the PR pattern as an etching mask, and a step of stripping the PR pattern, to form an interlayer insulating layer 122 including two active contact holes 123 and one first gate contact hole 124. Both side portions of the active layer 115 are exposed by the active contact holes 123. A center portion of the active layer 155 is covered with a portion of the interlayer insulating layer 122 between the active contact holes 123. The interlayer insulating layer 122 covering the center portion of the active layer 155 serves as an etch-stopper. The first gate contact hole 124 exposes a portion of the gate insulating layer 110. The first gate contact hole 124 is disposed at the left-side of the active layer 115. The first gate contact hole 124 is provided to form the second gate contact hole 142 (of FIG. 4N) exposing the gate electrode 107.

Next, as shown in FIG. 4I, a cleaning process using a buffered oxide etchant (BOE) may be performed onto the substrate 101 including the interlayer insulating layer 122. It may be called as a BOE cleaning process. Without the BOE cleaning process, a thermal oxidation layer (not shown) is formed on the active layer 115. The BOE cleaning process is performed to remove the thermal oxidation layer through the active contact holes 123.

In addition, when the gate insulating layer 110 is formed of silicon oxide, the exposed portion of the gate insulating layer 110 through the first gate contact hole 124 is etched by the BOE cleaning process such that a thickness of the gate insulating layer 110 corresponding to the first gate contact hole 124 is reduced.

The gate insulating layer 110 partially remains after the BOE cleaning process such that the gate electrode 107 is not exposed through the first gate contact hole 124 directly after the BOE cleaning process. If the gate insulating layer 110 is completely removed to expose the gate electrode 107 and the gate electrode 107 is formed of impurity-doped polycrystalline silicon, the gate electrode 107 may be etched by a dry-etching process for forming ohmic contact layers 127a and 127b (of FIG. 4J).

By reducing the thickness of the gate insulating layer 110, a process time for forming the second gate contact hole 142 (of FIG. 4K) is decreased. However, the process of reducing the thickness of the gate insulating layer 110 is not essential.

When the gate insulating layer 110 is formed of other material, the gate insulating layer 110 is not etched during the BOE cleaning process.

The intrinsic amorphous silicon layer 111 (of FIG. 4A) is directly exposed to the crystallizing process under a high temperature of 600 to 800° C. to form the active layer 115. As a result, a thermal oxidation layer (not shown) is formed on a top surface of the active layer 115. An ohmic contact property between the active layer 115 and the ohmic contact layers 127a and 127b (or the barrier layer) is degraded by the thermal oxidation layer. Accordingly, the BOE cleaning process can be performed onto the active layer 115 to remove the thermal oxidation layer before the step of forming the ohmic contact layers 127a and 127b (or the barrier layer).

Next, as shown in FIG. 4J, a barrier layer (not shown) having a thickness of about 50 to 300 Å is formed on the interlayer insulating layer 122 by depositing intrinsic amorphous silicon. Sequentially, an impurity-doped amorphous silicon layer (not shown) and a first metal layer (not shown) are formed on the barrier layer by respectively depositing impurity-doped amorphous silicon and a metallic material. The impurity-doped amorphous silicon layer has a thickness of about 100 to 300 angstroms. The metallic material for the first metal layer includes aluminum (Al), Al alloy, copper (Cu), Cu alloy, molybdenum (Mo), Mo alloy, chromium (Cr), Cr alloy and molybdenum-titanium alloy (MoTi).

A contact strength between intrinsic amorphous silicon and intrinsic polycrystalline silicon is larger than that between impurity-doped amorphous silicon and intrinsic polycrystalline silicon. Accordingly, the barrier layer of intrinsic amorphous silicon is positioned between the active layer 115 and the impurity-doped amorphous silicon layer to improve a contact strength between the active layer 115 of intrinsic polycrystalline silicon and the impurity-doped amorphous silicon layer. In addition, a contact resistance between the active layer 115 of intrinsic polycrystalline silicon and the impurity-doped amorphous silicon layer is reduced due to the barrier layer of intrinsic amorphous silicon.

The first metal layer, the impurity-doped amorphous silicon layer and the barrier layer are patterned by a mask process to form a data line 130, a source electrode 133, a drain electrode 136, first and second ohmic contact layers 127a and 127b, and first and second barrier patterns (not shown). The data line 130 is disposed at a boundary of the pixel region P and is connected to the source electrode 133. The first and second barrier patterns, the first and second ohmic contact layers 127a and 127b, the source electrode 133 and the drain electrode 136 are disposed in the switching region TrA. The first barrier pattern contacts the exposed active layer 115 through one of the active contact holes 123 of the interlayer insulating layer 122, and the first ohmic contact layer 127a and the source electrode 133 are stacked on the first barrier pattern. The second barrier pattern contacts the exposed active layer 115 through the other one of the active contact holes 123 of the interlayer insulating layer 122, and the second ohmic contact layer 127b and the drain electrode 136 are stacked on the second barrier pattern. Namely, the first barrier pattern, the first ohmic contact layer 127a and the source electrode 133 are spaced apart from the second barrier pattern, the second ohmic contact layer 127b and the drain electrode 136, respectively. Since the first barrier pattern, the first ohmic contact layer 127a and the source electrode 133 are patterned by a single mask process, they have substantially the same plane area and the same plane shape as one another to perfectly overlap one another. Similarly, the second barrier pattern, the second ohmic contact layer 127b and the drain electrode 136 have substantially the same plane area and the same plane shape as one another. The data line 130, the source electrode 133 and the drain electrode 136 each having a single-layered structure is shown. Alternatively, each of the data line 130, the source electrode 133 and the drain electrode 136 may have a double-layered structure or a triple-layered structure. For example, each of the data line 130, the source electrode 133 and the drain electrode 136 has a double-layered structure of Al alloy and Mo or a triple-layered structure of Mo, Al ally and Mo. The source electrode 133 is connected to the data line 130. In addition, a first dummy pattern 126 at the same layer as the ohmic contact layers 127a and 127b and a second dummy pattern (not shown) at the same layer as the barrier patterns are formed between the interlayer insulating layer 122 and the data line 130.

In the present invention, since a portion of the interlayer insulating layer 122 as the etch-stopper covers the center portion of the active layer 155, there is no damage on the active layer 115 during an dry-etching process for the ohmic contact layers 127a and 127b and the barrier patterns. In more detail, after the data line 130, the source electrode 133 and the drain electrode 136 are formed by patterning the first metal layer, the impurity-doped amorphous silicon layer exposed through the source and drain electrodes 133 and 136 and the intrinsic amorphous silicon layer under the impurity-doped amorphous silicon layer are dry-etched. In this case, since the interlayer insulating layer 122 covers the center portion of the active layer 115 during the dry-etching process for the ohmic contact layers 127a and 127b and the barrier patterns, the interlayer insulating layer 122 protects the active layer 115 such that a thickness of the active layer 115 is not reduced by the dry-etching process. Accordingly, the active layer 115 has an uniform thickness.

The gate electrode 107, the gate insulating layer 110, the active layer 115, the interlayer insulating layer 122, the first and second ohmic contact layers 127a and 127b and the source and drain electrodes 133 and 136 constitute the TFT Tr. The TFT Tr may further include the barrier patterns.

Although not shown, when the array substrate is used for the OELD device, a power line is formed at the same layer as the data line 130 to be parallel to the data line 130. In addition, a driving TFT having substantially the same structure as the above TFT Tr as a switching TFT and being connected to the above TFT Tr and the power line is further formed.

Next, as shown in FIG. 4K, a first passivation layer 140 is formed on the data line 130, the data pad electrode 138, the source electrode 133 and the drain electrode 136 by depositing an inorganic insulating material, for example, silicon oxide or silicon nitride, or an organic insulating layer, for example, photo-acryl or BCB.

The first passivation layer 140 and a portion of the gate insulating layer 110 are etched by a mask process to form the second gate contact hole 142. The second gate contact hole 142 corresponding to the first gate contact hole 124 and exposes the gate electrode 107. Since the first gate contact hole 124 has been formed through the interlayer insulating layer 122 and a thickness of the gate insulating layer 110 corresponding to the first gate contact hole 124 has been reduced by the BOE cleaning process, a process time for the second gate contact hole 142 can be decreased. When the second gate contact hole 142 is formed without the first gate contact hole 124, a process time for the second gate contact hole 142 is increased and production yield is decreased because all of the first passivation layer 140, the interlayer insulating layer 122 and the gate insulating layer 110 should be etched.

However, in the present invention, the first gate contact hole 124 is formed by etching the interlayer insulating layer 122 during a step of forming the active contact holes 123 and by partially etching the gate insulating layer 110 during the BOE cleaning process, a process time for the second gate contact hole 142 can be reduced.

Figure 5:
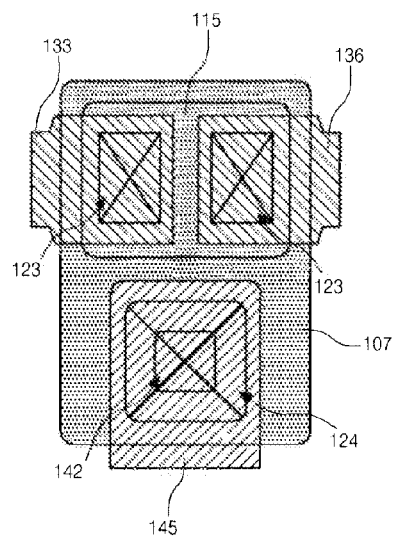
FIG. 5 is a plane view showing a switching region of an array substrate according to the present invention.

Referring to FIG. 5, which is a plane view showing a switching region of an array substrate according to the present invention, a size of the first gate contact hole 124 is larger than that of the second gate contact hole 142. It may be shown as a dual contact hole in a plane view.

Next, as shown in FIG. 4L, a second metal layer (not shown) is formed on the first passivation layer 140 including the second gate contact hole 142 by depositing a metallic material, for example, aluminum (Al), Al alloy, copper (Cu), Cu alloy, molybdenum (Mo), Mo alloy, chromium (Cr) or Cr alloy. The second metal layer is patterned by a mask process to form a gate line 145 contacting the gate electrode 107 through the second gate contact hole 142 and crossing the data line 130 to define the pixel region P. The gate line 145 having a single-layered structure is shown. Alternatively, the gate line 145 may have a double-layered structure or a triple-layered structure. For example, the gate line 145 has a double-layered structure of Al alloy and Mo or a triple-layered structure of Mo, Al ally and Mo.

Next, as shown in FIG. 4M, a second passivation layer 150 is formed on the gate line 145 by depositing an inorganic insulating material, for example, silicon oxide or silicon nitride or an organic insulating material, for example, photoacryl or BCB. The second passivation layer 150 and the first passivation layer 140 under the second passivation layer 150 are etched to form a drain contact hole 152 exposing the drain electrode 136.

Next, as shown in FIG. 4N, a transparent conductive material layer (not shown) is formed on the second passivation layer 150 including the drain contact hole 152 by depositing a transparent conductive material, for example, indium-tin-oxide (ITO) or indium-zinc-oxide (IZO). The transparent conductive material layer is patterned by a mask process to form a pixel electrode 170 contacting the drain electrode 136 through the drain contact hole 152 and positioned in each pixel region P. By the above process, the array substrate according to the present invention is obtained.

On the other hand, when the driving TFT is formed to use the array substrate for the OELD device, the pixel electrode 170 does not contact the drain electrode 136 of the TFT Tr as the switching TFT. The pixel electrode contacts a drain electrode of the driving TFT through a contact hole exposing the drain electrode of the driving TFT, and the first and second passivation layers 140 and 150 do not expose the drain electrode 136 of the TFT Tr. The TFT Tr in the switching region TrA is electrically connected to the driving TFT.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An array substrate for a display device, comprising:
   a gate electrode on a substrate;
   a gate insulating layer on the gate electrode and having the same plane area and the same plane shape as the gate electrode;
   an active layer on the gate insulating layer and exposing an edge of the gate insulating layer;
   an interlayer insulating layer on a surface of the substrate including the active layer formed thereon and including first and second active contact holes, the first and second active contact holes respectively exposing both sides of the active layer;
   first and second ohmic contact layers contacting the active layer through the first and second active contact holes, respectively;
   a source electrode on the first ohmic contact layer;
   a drain electrode on the second ohmic contact layer;
   a data line on the interlayer insulating layer and connected to the source electrode;
   a first passivation layer on a surface of the interlayer insulating layer including the source electrode, the drain electrode and the data line formed thereon, the first passivation layer, the interlayer insulating layer and the gate insulating layer have a first gate contact hole exposing a portion of the gate electrode;
   a gate line on the first passivation layer and contacting the gate electrode through the first gate contact hole, the gate line crossing the data line;
   a second passivation layer on a surface of the first passivation layer including the gate line formed thereon, the first passivation layer and the second passivation layer having a drain contact hole exposing the drain electrode; and
   a pixel electrode on the second passivation layer and contacting the drain electrode through the drain contact hole.

2. The substrate according to claim 1, wherein the interlayer insulating layer has a second gate contact hole corresponding to the first gate contact hole, where the gate insulating layer has a thickness in the second gate contact hole smaller than that in the other region.

3. The substrate according to claim 2, wherein a size of the second contact hole is larger than that of the first contact hole.

4. The substrate according to claim 1, wherein the gate electrode is formed of impurity-doped polycrystalline silicon and has a thickness of 500 to 1000 Å.

5. The substrate according to claim 1, wherein the gate electrode is formed of a metallic material having a melting point above 800° C. and has a thickness of 100 to 1000 Å.

6. The substrate according to claim 5, wherein the metallic material includes one of titanium (Ti), tungsten (Tw), molybdenum alloy, molybdenum (Mo), tantalum (Ta), copper (Cu), Cu alloy and combination thereof.

7. The substrate according to claim 1, wherein the first ohmic contact layer and the source electrode have substantially the same plane area and the same plane shape as each other, and the second ohmic contact layer and the drain electrode have substantially the same plane area and the same plane shape as each other.

8. The substrate according to claim 1, further comprising a buffer layer formed on the substrate.

9. A method of fabricating an array substrate for a display device, comprising:
   forming a gate electrode on a substrate, a gate insulating layer on the gate electrode and an active layer of intrinsic polycrystalline silicon on the gate insulating layer, the active layer exposing an edge of the gate insulating layer;
   forming an interlayer insulating layer on a surface of the substrate including the active layer formed thereon and having first and second active contact holes, the first and second active contact holes respectively exposing both sides of the active layer;
   forming first and second ohmic contact layers respectively contacting the both sides of the active layer through the first and second active contact holes, a source electrode on the first ohmic contact layer, a drain electrode on the second ohmic contact layer, and a data line connected to the source electrode;

forming a first passivation layer on a surface of the interlayer insulating layer including the source electrode, the drain electrode and the data line formed thereon, and including a first gate contact hole exposing the gate electrode;

forming a gate line on the first passivation layer and contacting the first gate electrode through the first gate contact hole, the gate line crossing the data line;

forming a second passivation layer on a surface of the first passivation layer including the gate line formed thereon, the first passivation layer and the second passivation layer including a drain contact hole exposing the drain electrode; and forming a pixel electrode on the second passivation layer and contacting the drain electrode through the drain contact hole.

10. The method according to claim 9, further comprising forming a buffer layer on the substrate before the step of forming the gate electrode, the gate insulating layer and the active layer.

11. The method according to claim 9, wherein the step of forming the interlayer insulating layer includes forming a second gate contact hole exposing the gate insulating layer and corresponding to the first gate contact hole.

12. The method according to claim 11, wherein a size of the second gate contact hole is larger than that of the first gate contact hole.

13. The method according to claim 11, further comprising performing a buffer oxide cleaning (BOE) process to partially remove the gate insulating layer through the second gate contact hole, wherein the gate insulating layer has a first thickness in the second gate contact hole smaller than a second thickness in other regions.

14. The method according to claim 13, wherein the gate insulating layer is formed of silicon oxide.

15. The method according to claim 9, wherein the step of forming the gate electrode, the gate insulating layer and the active layer includes:

sequentially forming a gate material layer, an insulating layer and an intrinsic amorphous silicon layer on the substrate, wherein the gate material layer is formed of impurity-doped polycrystalline silicon or a metallic material having a melting point above 800° C.;

performing a crystallizing process to crystallize the intrinsic amorphous silicon layer into an intrinsic polycrystalline silicon layer;

forming first, second and third photoresist (PR) patterns on the intrinsic polycrystalline silicon layer, the first PR pattern having a first thickness, the second and third PR patterns each having a second thickness smaller than the first thickness, wherein the second PR pattern is positioned at one end of the first PR pattern, and the third PR pattern is positioned at the other end of the first PR pattern;

etching the polycrystalline silicon layer exposed by the first, second and third PR patterns, and the insulating layer and the gate material layer under the exposed polycrystalline silicon layer to form the gate electrode, the gate insulating layer on the gate electrode and an intrinsic polycrystalline silicon pattern on the gate insulating layer;

ashing the first, second and third PR patterns to expose sides of the intrinsic polycrystalline silicon pattern by removing the second and third PR pattern and form a fourth PR pattern from the first PR pattern; and etching the exposed sides of the intrinsic polycrystalline silicon pattern to form the active layer.

16. The method according to claim 15, wherein the crystallizing process is one of a thermal crystallization process, an alternating magnetic field crystallization process and an excimer laser annealing process.

17. The method according to claim 15, wherein the crystallizing process is performed under a temperature of 600 to 800° C.

18. The method according to 15, wherein the metallic material includes one of titanium (Ti), tungsten (Tw), molybdenum alloy, molybdenum (Mo), tantalum (Ta), copper (Cu), Cu alloy and combination thereof.

19. The method according to claim 9, wherein the step of forming the first and second ohmic contact layers, the source and drain electrodes and the data line includes:

sequentially forming an impurity-doped amorphous silicon layer and a metal layer on the interlayer insulating layer; and sequentially patterning the impurity-doped amorphous silicon layer and the metal layer to form the first and second ohmic contact layers, the source and drain electrodes and the data line.

20. The method according to claim 19, wherein the first ohmic contact layer and the source electrode have substantially the same plane area and the same plane shape as each other, and the second ohmic contact layer and the drain electrode have substantially the same plane area and the same plane shape as each other.

* * * * *